United States Patent
Parker et al.

(10) Patent No.: US 9,431,816 B2
(45) Date of Patent: Aug. 30, 2016

(54) DIRECT CURRENT ARC FAULT DETECTOR AND CIRCUIT INTERRUPTER, AND METHOD OF DETECTING AN ARC IN A DIRECT CURRENT POWER CIRCUIT

(71) Applicant: EATON CORPORATION, Cleveland, OH (US)

(72) Inventors: Kevin L. Parker, Pittsburgh, PA (US); Theodore J. Miller, Oakdale, PA (US)

(73) Assignee: EATON CORPORATION, Cleveland, OH (US)

( * ) Notice: Subject to any disclaimer, the term of this patent is extended or adjusted under 35 U.S.C. 154(b) by 768 days.

(21) Appl. No.: 13/629,714

(22) Filed: Sep. 28, 2012

(65) Prior Publication Data
US 2014/0095086 A1  Apr. 3, 2014

(51) Int. Cl.
H02H 1/00 (2006.01)
H02H 3/087 (2006.01)

(52) U.S. Cl.
CPC ........... *H02H 1/0015* (2013.01); *H02H 3/087* (2013.01)

(58) Field of Classification Search
CPC .... G01R 31/02; G06F 19/00; H02H 1/0015; H02H 3/087
USPC .......................................... 702/58; 361/93.1
See application file for complete search history.

(56) References Cited

U.S. PATENT DOCUMENTS

| | | |
|---|---|---|
| 5,224,006 A | 6/1993 | MacKenzie et al. |
| 5,432,455 A | 7/1995 | Blades |
| 5,434,509 A | 7/1995 | Blades |
| 5,691,869 A | 11/1997 | Engel et al. |
| 5,729,145 A | 3/1998 | Blades |
| 6,522,228 B2 | 2/2003 | Wellner et al. |
| 6,522,509 B1 | 2/2003 | Engel et al. |

(Continued)

FOREIGN PATENT DOCUMENTS

AU  2002300188 B2  9/2006

OTHER PUBLICATIONS

Luebke et al., "Field Test Results of DC Arc Fault Detection on Residentail and Utility Scale PV Arrays," Photovoltaic Specialists Conference PVSC 2011 IEEE, Jun. 19-24, 2011.*

(Continued)

*Primary Examiner* — Mohamed Charioui
*Assistant Examiner* — Catherine Rastovski
(74) *Attorney, Agent, or Firm* — Eckert Seamans Cherin & Mellott, LLC; Grant E. Coffield; Nathaniel C. Wilks

(57) ABSTRACT

A direct current arc fault detector includes a first current sensor sensing an alternating current component of current flowing in a DC power circuit; a second current sensor sensing a DC component of the current; and a bandpass filter filtering the sensed AC component. A demodulating logarithmic amplifier includes an input of the filtered AC component, and an output. An integrator or minimum detector includes an input connected to the amplifier output, and an output. A processor repetitively inputs and then resets the integrator or minimum detector output, and determines an arc when, for a predetermined time: the sensed DC component being greater than a first predetermined value, and a present value of the integrator or minimum detector output being greater than or different from a previous value of such output by more than a second predetermined value, or the present value being greater than a third predetermined value.

16 Claims, 8 Drawing Sheets

(56) References Cited

U.S. PATENT DOCUMENTS

| | | |
|---|---|---|
| 6,542,056 B2 | 4/2003 | Nerstrom et al. |
| 6,577,138 B2 | 6/2003 | Zuercher et al. |
| 6,710,688 B2 | 3/2004 | Wellner et al. |
| 8,089,737 B2 | 1/2012 | Parker et al. |
| 2005/0203672 A1 | 9/2005 | Restrepo et al. |
| 2005/0286185 A1 | 12/2005 | Henson et al. |
| 2007/0208981 A1 | 9/2007 | Restrepo et al. |
| 2008/0091308 A1* | 4/2008 | Henson et al. ............... 700/293 |
| 2008/0106832 A1 | 5/2008 | Restrepo et al. |
| 2009/0040665 A1 | 2/2009 | Elms et al. |
| 2009/0161270 A1* | 6/2009 | Beatty et al. .................. 361/42 |
| 2010/0033888 A1* | 2/2010 | Dougherty ................... 361/93.2 |
| 2010/0157486 A1* | 6/2010 | Parker et al. .................... 361/2 |
| 2011/0141644 A1* | 6/2011 | Hastings et al. ............. 361/93.2 |

OTHER PUBLICATIONS

European Patent Office, "International Search Report and Written Opinion", Nov. 21, 2013, 10 pp.

Restrepo, C., "Arc Fault Detection and Discrimination Methods", 4.4 IEEE, 2007, pp. 115-122.

* cited by examiner

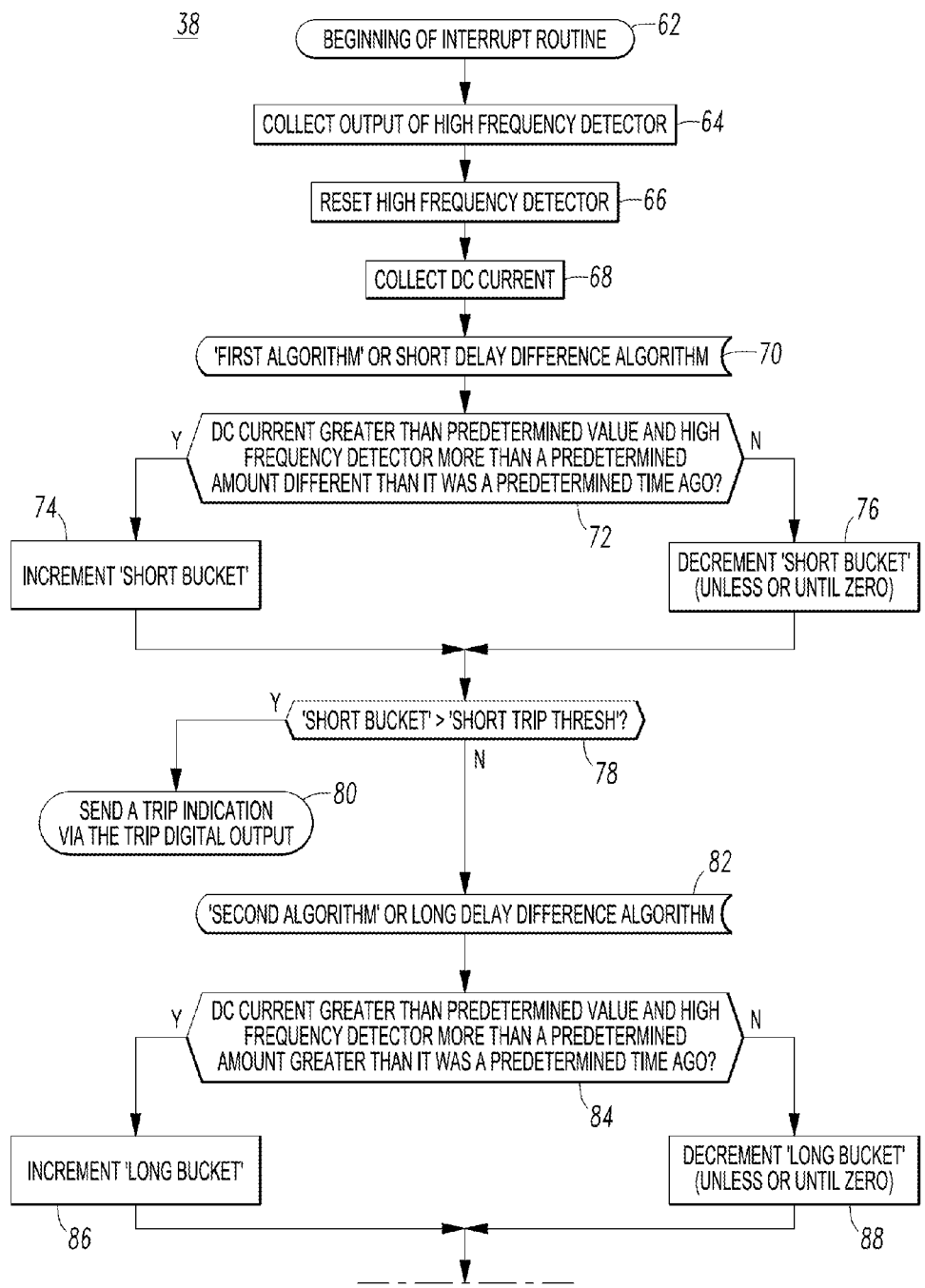
*FIG.3B1*

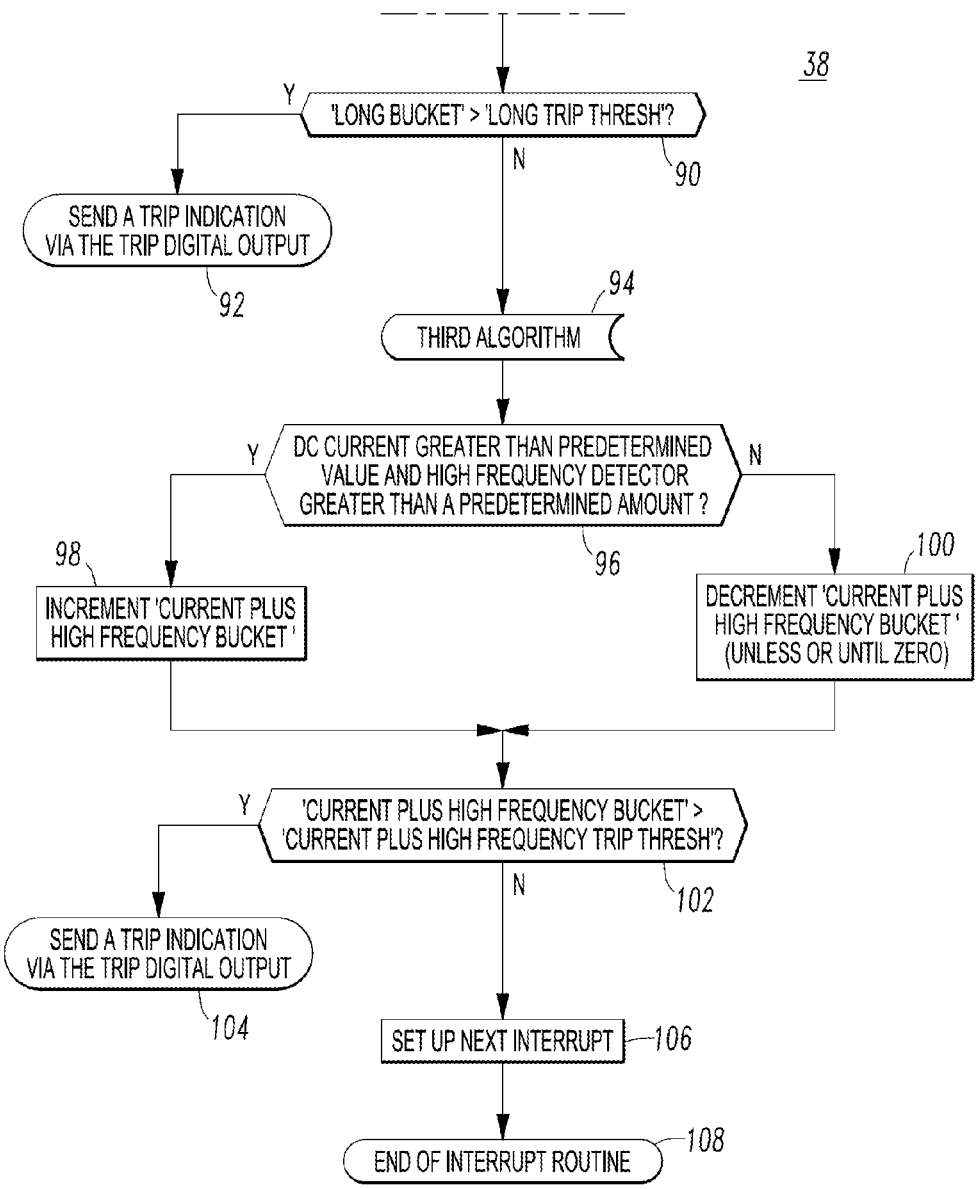
FIG.3B2

DIRECT CURRENT ARC FAULT DETECTOR AND CIRCUIT INTERRUPTER, AND METHOD OF DETECTING AN ARC IN A DIRECT CURRENT POWER CIRCUIT

BACKGROUND

1. Field

The disclosed concept pertains generally to direct current (DC) circuit interrupters and, more particularly, to DC arc fault circuit interrupters. The disclosed concept further pertains to DC arc fault detectors. The disclosed concept also pertains to methods of detecting arcs in DC power circuits.

2. Background Information

When a harmful arc occurs in an electric power system, it produces broadband electrical noise that propagates through the conductors of the power system. Most arc fault detectors (AFDs) work by monitoring the broadband noise in a power circuit and causing a trip if the broadband noise fits expected signal characteristics of an arc.

U.S. Pat. No. 8,089,737 discloses an alternating current (AC) arc fault circuit interrupter (AFCI) including separable contacts, an operating mechanism to open and close the separable contacts, and an arc fault detector to detect an arc fault condition operatively associated with the separable contacts. The arc fault detector includes a tuned current sensor to sense broadband noise of an AC current flowing through the separable contacts, a compression circuit, such as a demodulating logarithmic amplifier, including an input of sensed broadband noise from the tuned current sensor and an output. The compression circuit compresses the dynamic range of the sensed broadband noise. A minimum detector includes an input of the compression circuit output and an output of the minimum value of the minimum detector input. A processor includes a number of inputs and an output. One of the inputs is the minimum value output of the minimum detector. A trip mechanism cooperates with the processor output and the operating mechanism to trip open the separable contacts responsive to the detected arc fault condition.

Solar panels (e.g., without limitation, collections of relatively large photodiodes) are passive devices and typically produce no broadband noise when generating power. In a solar power system, an inverter is used to convert direct current (DC) power generated by a photovoltaic (PV) array into AC power similar to what is distributed by conventional electric utilities. Inverters tend to produce discrete bursts of broadband noise when power devices within the inverter change state. Since a large component of the power dissipated in an inverter is directly proportional to the duration of the inverter switch turn-on and turn-off times, this switching time is usually minimized.

On the other hand, an arc tends to conduct indefinitely once struck. This is particularly true in solar power systems, where the available voltage (which can be several hundred DC volts) is usually much greater than the minimum voltage required to sustain an arc (e.g., about 30 to 70 VDC) and where there are no voltage "zero crossings" as in AC power systems.

Hence, a DC arc fault detector needs to accurately distinguish between relatively short duration noise bursts produced by inverters (the normal case) and continuous, relatively long duration noise produced by arc faults (an extremely rare case).

Another complication is that the noise bursts produced by a particular inverter may be much higher in amplitude than continuous noise that results from an arc fault.

A still further challenge is to correctly distinguish between noise produced by arc faults and spurious signals that may couple into the PV array from radiating sources or leak in from the AC side of the inverter.

There is room for improvement in arc fault detectors for direct current power circuits.

There is also room for improvement in arc fault circuit interrupters for direct current power circuits.

There is still further room for improvement in methods of detecting arcs in direct current power circuits.

SUMMARY

These needs and others are met by embodiments of the disclosed concept in which a bandpass filter filters a sensed alternating current component of current flowing in a direct current power circuit; a demodulating logarithmic amplifier includes an input of the filtered alternating current component of the current flowing in the direct current power circuit, and an output; an integrator or minimum detector circuit includes an input electrically connected to the output of the demodulating logarithmic amplifier, and an output; and a processor: (i) repetitively inputs and then resets the output of the integrator or minimum detector circuit, and (ii) determines an arc in the direct current power circuit when, for a predetermined time: (a) the sensed direct current component of the current flowing in the direct current power circuit being greater than a first predetermined value, and (b) a present value of the output of the integrator or minimum detector circuit being greater than or different from a previous value of the output of the integrator or minimum detector circuit by more than a second predetermined value, or the present value of the output of the integrator or minimum detector circuit being greater than a third predetermined value.

In accordance with one aspect of the disclosed concept, a direct current arc fault detector is for a direct current power circuit having a current flowing therein. The direct current arc fault detector comprises: a first current sensor structured to sense an alternating current component of the current flowing in the direct current power circuit; a second current sensor structured to sense a direct current component of the current flowing in the direct current power circuit; a bandpass filter structured to filter the sensed alternating current component of the current flowing in the direct current power circuit; a demodulating logarithmic amplifier including an input of the filtered alternating current component of the current flowing in the direct current power circuit, and an output; an integrator or minimum detector circuit including an input electrically connected to the output of the demodulating logarithmic amplifier, and an output; and a processor structured to: (i) repetitively input and then reset the output of the integrator or minimum detector circuit, and (ii) determine an arc in the direct current power circuit when, for a predetermined time: (a) the sensed direct current component of the current flowing in the direct current power circuit being greater than a first predetermined value, and (b) a present value of the output of the integrator or minimum detector circuit being greater than or different from a previous value of the output of the integrator or minimum detector circuit by more than a second predetermined value, or the present value of the output of the integrator or minimum detector circuit being greater than a third predetermined value.

As another aspect of the disclosed concept, a direct current arc fault circuit interrupter is for a direct current power circuit having a current flowing therein. The direct current arc fault circuit interrupter comprises: separable contacts electrically connectable in series with the direct current power circuit; an operating mechanism structured to open and close the separable contacts; a first current sensor structured to sense an alternating current component of the current flowing in the direct current power circuit; a second current sensor structured to sense a direct current component of the current flowing in the direct current power circuit; a bandpass filter structured to filter the sensed alternating current component of the current flowing in the direct current power circuit; a demodulating logarithmic amplifier including an input of the filtered alternating current component of the current flowing in the direct current power circuit, and an output; an integrator or minimum detector circuit including an input electrically connected to the output of the demodulating logarithmic amplifier, and an output; and a processor structured to: (i) repetitively input and then reset the output of the integrator or minimum detector circuit, and (ii) determine an arc in the direct current power circuit when, for a predetermined time: (a) the sensed direct current component of the current flowing in the direct current power circuit being greater than a first predetermined value, and (b) a present value of the output of the integrator or minimum detector circuit being greater than or different from a previous value of the output of the integrator or minimum detector circuit by more than a second predetermined value, or the present value of the output of the integrator or minimum detector circuit being greater than a third predetermined value, wherein the processor comprises a routine and an output structured to cause the operating mechanism to trip open the separable contacts in response to: (i) incrementing an arc fault accumulator when: (a) the present value of the output of the integrator or minimum detector circuit is greater than or different from the previous value of the output of the integrator or minimum detector circuit by more than the second predetermined value, or (b) the present value of the output of the integrator or minimum detector circuit is greater than the third predetermined value for the predetermined time, or otherwise decrementing the arc fault accumulator, and (ii) determining that the arc fault accumulator is greater than a fourth predetermined value and responsively setting the output of the processor to cause the operating mechanism to trip open the separable contacts.

As another aspect of the disclosed concept, a method of detecting an arc in a direct current power circuit having a current flowing therein comprises: sensing an alternating current component of the current flowing in the direct current power circuit; sensing a direct current component of the current flowing in the direct current power circuit; bandpass filtering the sensed alternating current component of the current flowing in the direct current power circuit; providing a value proportional to a logarithm of an envelope of the bandpass filtered alternating current component of the current flowing in the direct current power circuit; integrating the value to provide an integrated value; and repetitively inputting and then resetting the integrated value; determining an arc in the direct current power circuit when, for a predetermined time: (a) the sensed direct current component of the current flowing in the direct current power circuit being greater than a first predetermined value, and (b) a present value of the integrated value being greater than or different from a previous value of the integrated value by more than a second predetermined value, or the present value of the integrated value being greater than a third predetermined value.

BRIEF DESCRIPTION OF THE DRAWINGS

A full understanding of the disclosed concept can be gained from the following description of the preferred embodiments when read in conjunction with the accompanying drawings in which:

FIGS. 3A and 3B1-3B2 are flowcharts of routines executed by the processor of FIG. 1.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The disclosed concept is described in association with a single pole arc fault detector and circuit interrupter, although the disclosed concept is applicable to a wide range of arc fault circuit interrupters having any number of poles.

Figure 1:
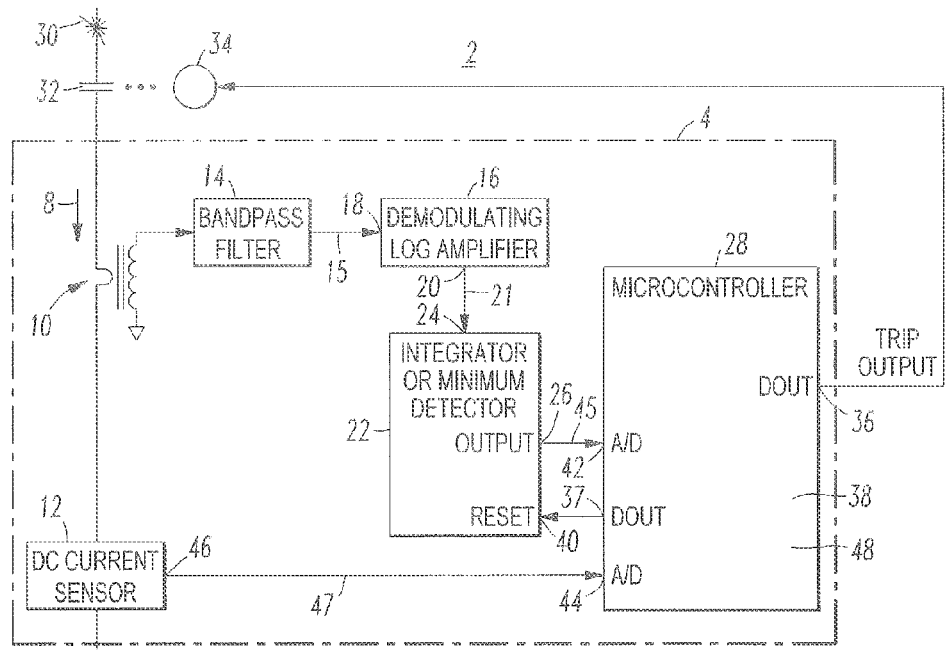
FIG. 1 is a block diagram in schematic form of an arc fault circuit interrupter in accordance with embodiments of the disclosed concept.

FIG. 1 shows an arc fault circuit interrupter 2 including a direct current (DC) arc fault detector 4 for a DC power circuit 6 having a current 8 flowing therein. The DC arc fault detector 4 includes a first current sensor, such as the example current transformer (CT) 10, structured to sense an AC component (e.g., without limitation, inverter noise; arc fault current) of the current 8 flowing in the DC power circuit 6, and a second current sensor, such as the example Hall effect sensor 12, structured to sense a DC component of the current 8. A bandpass filter 14 is structured to filter the sensed AC component of the current 8. A demodulating logarithmic amplifier (log amplifier) 16 includes an input 18 of the filtered AC component (filtered signal 15) of the current 8 and an output 20. An integrator or minimum detector circuit 22 includes an input 24 electrically connected to the output 20 of the demodulating logarithmic amplifier 16 and an output 26.

As will be explained in greater detail in connection with FIGS. 3B1-3B2, a processor, such as the example microcontroller 28, is structured to: (i) repetitively input and then reset the output 26 of the integrator or minimum detector circuit 22, and (ii) determine an arc 30 (e.g., without limitation, a series DC arc) in the DC power circuit 6 when, for a predetermined time: (a) the sensed DC component (analog signal 47) of the current 8 being greater than a first predetermined value, and (b) a present value of the output 26 of the integrator or minimum detector circuit 22 being different from a previous value of the output 26 of the integrator or minimum detector circuit 22 by more than a second predetermined value, or the present value of the output 26 of the integrator or minimum detector circuit 22 being greater than a third predetermined value.

For example and without limitation, the bandpass filter 14 has a center frequency of about 10.7 MHz with about a 280 kHz pass band.

Alternatively, the second current sensor 12 can be a resistor electrically connected in series with a photovoltaic array (not shown) in the DC power circuit 6.

In addition to the DC arc fault detector 4, the DC arc fault circuit interrupter 2 includes separable contacts 32 electrically connectable in series with the DC power circuit 6, and an operating mechanism, such as the example trip coil 34, structured to open and close the separable contacts 32.

The microcontroller 28 includes two example digital outputs 36,37. The digital output 36, which indicates the presence of the arc fault 30, is activated by the microcontroller 28 to energize the trip coil 34 and cause the opening of the separable contacts 32 in response to a routine 38 (FIGS. 3B1-3B2). The other digital output 37 is used to control a reset input 40 of the integrator or minimum detector circuit 22. The microcontroller 28 also includes two example analog-to-digital (A/D) inputs 42,44. The A/D input 42 inputs the output 26 of the integrator or minimum detector circuit 22 and provides a digital value from the analog signal 45 to the routine 38. The other A/D input 44 inputs the output 46 of the DC current sensor 12 and provides a digital value from the analog signal 47 to the routine 38.

EXAMPLE 1

The DC arc fault detector 4 can be employed for photovoltaic (PV) applications. As shown in FIG. 1, the AC component of the current 8 is sensed using a suitable current sensor, such as the example CT 10. The output of the CT 10 is filtered by a relatively narrow bandpass filter 14, in order that a relatively narrow band of the original high frequency spectrum is allowed to pass. The function of the bandpass filter 14 is to deeply attenuate most of the signal spectrum and ideally eliminate noise coupled into a PV array (not shown) from radiating sources. Next, the filtered signal 15 is input by the demodulating logarithmic amplifier (log amp) 16. For example, the log amp 16 consists of several cascaded, saturable gain stages (not shown). This configuration provides a fixed voltage change for a given multiplication of the input filtered signal 15. The output 20 of the log amp 16 is filtered and the net result is an output signal 21 that is proportional to the logarithm of the envelope of the input signal 15. In simple terms, the function of the input circuit is that when there is no electrical noise in the PV array, the output 20 of the log amp 16 is low, and when there is electrical noise in the PV array that is within the passband of the filter 14, the log amp output 20 goes up. Next, the log amp output 20 is input by the integrator or minimum detector circuit 22, and the voltage of the analog signal 45 of the output 26 is read and then reset periodically by the microcontroller 28.

EXAMPLE 2

Figure 2:
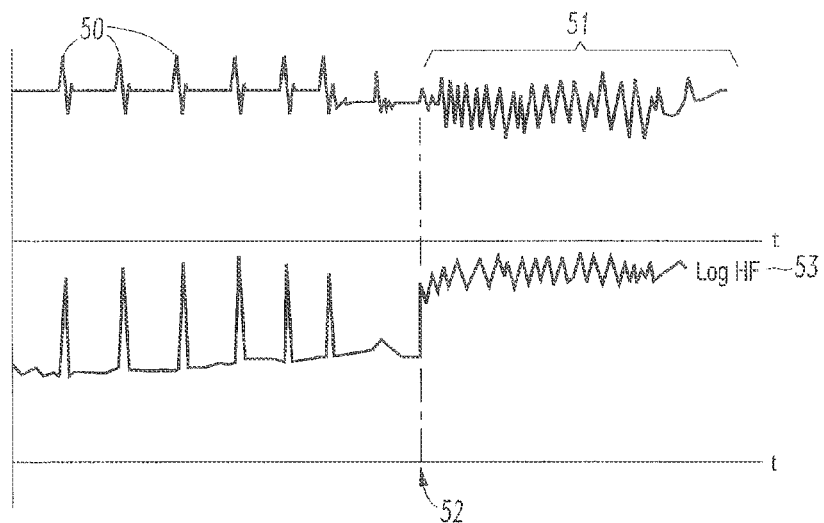
FIG. 2 is a plot of periodic noise bursts produced by an inverter and continuous noise produced by an arc.
Figure 3A:
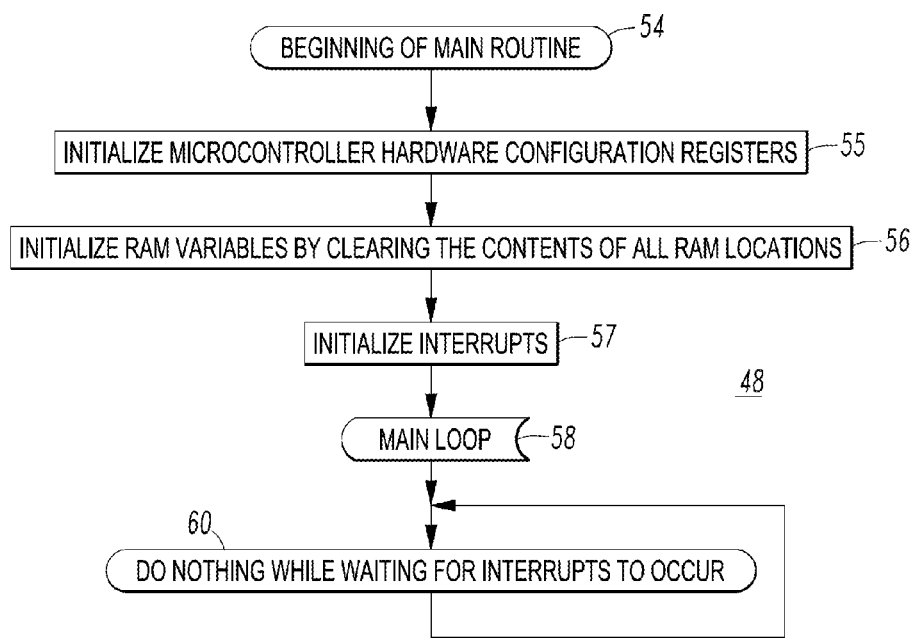

FIG. 2 shows a plot of periodic, non-continuous noise bursts 50 produced by switching of an inverter (not shown) and continuous noise 51 produced by an arc (not shown, but see the arc 30 of FIG. 1), which occurs at 52. The logarithm of the AC component of the noise 50,51 is shown by plot 53 (LogHF).

The operating principle is that relatively short noise bursts produced by inverter switching will not significantly increase the voltage of the analog signal 45 output by the integrator or minimum detector circuit 22, but typical noise caused by continuous arcing causes the voltage of the analog signal 45 to increase to a greater extent. Relatively low levels of the voltage of the analog signal 45 indicate no arcing, while relatively higher levels indicate arcing.

The disclosed concept distinguishes between the periodic noise bursts 50 produced by an inverter (not shown) and the continuous noise 51 produced by an arc. As will be discussed in connection with FIGS. 3B1-3B2, as the microcomputer 28 samples the output 26 of FIG. 1 and determines whether an arc, such as 30, is occurring in the DC power circuit 6 (e.g., without limitation, as part of a PV array (not shown)). The analog signal 45 of the output 26 during a non-arcing condition is a function of the net gain of the DC AFD circuit 4 (which may vary from device to device) and also the characteristics of the particular PV array and inverter. Hence, determining a "baseline" output level for the "no arcing" case for a particular system is believed to be difficult. One way around this problem is to try to measure the "no arcing" baseline. If the PV array is operating and there is no arcing, then these conditions establish the value of the output 26 at a certain level. If an arc should occur, then the value of the output 26 should increase. The microcontroller 28 can keep a record of past output values, and then detect potential arcs by comparing them with more recent values and looking for a step increase or for other changes. As will be discussed, two of three example DC AFD algorithms, as are discussed below, work in this manner.

If the PV system starts up into an arc, then there is no opportunity to establish an initial no-arc "baseline". Since the arc must still be detected, a third example DC AFD algorithm compares the value of the output 26 to a predetermined value. If multiple samples of the output 26 exceed the predetermined value, then the microcontroller 28 assumes that there is an arc occurring and responsively causes the separable contacts 32 to trip open.

FIGS. 3A and 3B1-3B2 are flowcharts of routines 48,38 executed by the microcontroller 28 of FIG. 1. The main routine 48 of FIG. 3A begins at 54. Next, at 55, the microcontroller hardware configuration registers are initialized. Then, at 56, RAM variables are initialized by clearing the contents of all RAM locations (not shown). Next, at 57, interrupts are initialized. Then, at 58, a main loop is executed. Step 60 does nothing while waiting for interrupts to occur.

Referring to FIGS. 3B1-3B2, the interrupt routine 38 begins at 62. Then at 64, the output of a high frequency detector circuit is collected by converting and reading the analog signal 45 of the output 26 of FIG. 1. Next, at 66, the high frequency integrator or minimum detector circuit 22 is reset by momentarily activating the digital output 37. Then, at 68, the DC current from the DC current sensor 12 is collected by converting and reading the analog signal 47.

Next, at 70, a first short delay difference algorithm is executed. Then, at 72, it is determined if the DC current is greater than a predetermined value (e.g., without limitation, 2 ADC; any suitable value), and if the converted analog signal 45 of the output 26 of FIG. 1 is more than a predetermined amount (e.g., without limitation, any suitable value; an empirically determined value) different (i.e., a positive or a negative difference) than it was a predetermined time (e.g., without limitation, about 20 milliseconds; any suitable time) ago.

For example and without limitation, for the log amplifier 16, the voltage of the output 20 represents a multiplication of current, such as 2.1 times the sensed AC component of the current 8. The resulting voltages that are generated from this sensed AC component have little meaning, since the sensed AC component is expected to be white noise over the frequency bandwidth being sensed. Ultimately, the gains of the AC current sensor 10, the bandpass filter 14, the log amplifier 16 and the integrator or minimum detector circuit 22 all contribute to the overall system gain. If the current 8 changed, for example, from 10 nA/sqrt(Hz) to 21 nA/sqrt (Hz) or from 1.0 nA/sqrt(Hz) to 2.1 nA/sqrt(Hz), then the output 20 would in both cases produce the same delta in voltage. In both situations, the routine 38 would react the same way and does not respond to absolute current levels. The routine 38 is responsive to changes at the output 20 which are equivalent to multiplications of the input current 8.

If so at 72, then at 74 an accumulator (e.g., without limitation, a "short bucket") is incremented. Otherwise, at 76, the "short bucket" is decremented (unless or until it is zero). Next, at 78, it is determined if the "short bucket" is greater than a predetermined "short trip threshold" (e.g., without limitation, any suitable value).

For example and without limitation, the "short bucket" starts at 0. The "short bucket" is incremented by 5 for each sample that the short delay difference conditions are met and is decremented by 1 (unless zero) for each sample that the short delay difference conditions are not met. If the "short bucket" is ever greater than an example "short trip threshold" of 500, then a trip request is issued. The short delay difference algorithm is performed every 2 milliseconds, so the short delay difference minimum trip time (to count to 500 by 5) is 100 samples times 2 milliseconds per sample, or 200 milliseconds. In this example and the two examples that follow, the algorithm, trip threshold and sampling are set up so that: (1) the trip time is short enough to meet the 800 millisecond arc clearing time required by UL1699B with plenty of margin; and (2) long enough that short duration, spurious noise events which are not arcs do not produce "unwanted trips". That is, once an arc is struck, it should persist indefinitely. So, if a noise event occurs that does not persist, then presumably it is not an arc and a trip request should not issue. If the test passes at 78, then at 80, a trip signal is set via the trip digital output 36. As will be discussed, below, in connection with FIGS. 6 and 7, incrementing the accumulator or "short bucket" corresponds to the filtered AC component of the current 8 of FIG. 1 having a substantial fluctuation during the occurrence of the arc 30.

On the other hand, if the test was false at 78, then at 82, a second long delay difference algorithm is run. At 84, it is determined if the DC current is greater than a predetermined value (e.g., without limitation, 2 ADC; any suitable value), and if the converted analog signal 45 of the output 26 of FIG. 1 is more than a predetermined amount (e.g., without limitation, any suitable value; an empirically determined value; somewhat similar to step 72, the corresponding multiplication of current is 4.2 times) greater than it was a predetermined time (e.g., without limitation, about 1 second; any suitable time sufficiently greater than the time of step 72) ago. If so, then at 86 an accumulator (e.g., without limitation, a "long bucket") is incremented. Otherwise, at 88, the "long bucket" is decremented (unless or until it is zero). Next, at 90, it is determined if the "long bucket" is greater than a predetermined "long trip threshold" (e.g., without limitation, any suitable value).

For example and without limitation, the "long bucket" starts at 0. The "long bucket" is incremented by 2 for each sample that the long delay difference conditions are met and decremented by 1 (unless zero) for each sample that the long delay difference conditions are not met. If the "long bucket" is ever greater than the "long trip threshold" of 150, then a trip request is issued. The long delay difference algorithm is performed every 2 milliseconds, so the minimum long delay difference trip time (to count to 150 by 2) is 75 samples times 2 milliseconds per sample, or 150 milliseconds. If the test passes at 90, then at 92, a trip signal is set via the trip digital output 36. As will be discussed, below, in connection with FIGS. 4 and 5, incrementing the accumulator or "long bucket" corresponds to the filtered AC component of the current 8 of FIG. 1 having a step change during the occurrence of the arc 30.

On the other hand, if the test was false at 90, then at 94, a third algorithm is run. At 96, it is determined if the DC current is greater than a predetermined value (e.g., without limitation, 2 ADC; any suitable value), and if the converted analog signal 45 of the output 26 of FIG. 1 is more than a predetermined value (e.g., without limitation, 15 nA/sqrt (Hz); any suitable value). If so, then at 98 an accumulator (e.g., without limitation, a "current plus high frequency bucket") is incremented. Otherwise, at 100, the "current plus high frequency bucket" is decremented (unless or until it is zero). Next, at 102, it is determined if the "current plus high frequency bucket" is greater than a predetermined "current plus high frequency trip threshold" (e.g., without limitation, any suitable value).

For example and without limitation, the "current plus high frequency bucket" starts at 0. The "current plus high frequency bucket" is incremented by 2 if the "current plus high frequency" conditions are met; otherwise, it is decremented by 1 unless it is 0. If the value of the "current plus high frequency bucket" exceeds the "current plus high frequency trip threshold" of 100, then a trip request is issued. All three of the example algorithms are performed once every 2 milliseconds, so the minimum trip time for the "current plus high frequency" algorithm (that is, counting from 0 to 100 by 2) is 50 times 2 milliseconds, or 100 milliseconds. If the test passes at 102, then at 104, a trip signal is set via the trip digital output 36. Otherwise, at 106, then next interrupt is set up before the interrupt routine 38 ends at 108.

Each of the three example DC AFD algorithms of FIGS. 3B1-3B2 checks for a minimum DC current being present in the protected DC power circuit 6 before the microcontroller 28 can potentially cause a trip.

EXAMPLE 3

The current 8 of FIG. 1 (e.g., without limitation, PV array current) can be sensed by any suitable current sensor, such as for example and without limitation, by measuring the voltage across a resistor (shown as the DC current sensor 12 of FIG. 1) electrically connected in series with the PV array (not shown, but see the DC power circuit 6).

EXAMPLE 4

DC arc tests are performed per UL 1699B. The first DC AFD algorithm 70 (a short delay difference algorithm) and the second DC AFD algorithm 82 (a long delay difference algorithm) of FIGS. 3B1-3B2 are tested and various data is observed during those arc tests.

UL 1699B specifies a worst case trip time that a DC arc must be detected and interrupted is within 800 milliseconds. Hence, the first 800 milliseconds of data is of interest in the test data below. As a result, the interrupt routine 38 of FIGS. 3B1-3B2 is structured to detect and interrupt the arc 30 in 800 milliseconds or less.

During the DC arc fault testing, two major trends are observed: (1) the arc 30 can strike in a relatively stable fashion, resulting in a "step change" in the analog signal 45 of the output 26 of FIG. 1. Initially there is a "noise floor" when there is no arc followed by a significantly higher average signal level when the output 26 responds to continuous noise produced by the arc 30; and (2) the arc 30 can strike in an unstable fashion, resulting in the analog signal 45 of the output 26 "widely fluctuating", which is clearly distinguishable from the noise floor and can also be employed to detect the arc 30, albeit in a different manner than the "step change" of the first trend.

In addition, the DC arc fault testing shows variations of the two trends discussed above. For instance, the response of the integrator or minimum detector circuit 22 to the arc 30 might start off looking stable as in the first trend and then degenerate into noise of the second trend, or might start off looking unstable as in the second trend and then develop into a stable type of the first trend.

The first short delay difference DC AFD algorithm 70 and the second long delay difference DC AFD algorithm 82 function as follows. The DC AFD algorithm 70 addresses the second type arc fault in which the analog signal 45 of the output 26 of FIG. 1 fluctuates widely when a DC arc fault occurs. The second long delay difference DC AFD algorithm 82 addresses the first type arc fault in which the analog signal 45 of the output 26 of FIG. 1 makes a step increase when a DC arc fault occurs. Finally, if the DC arc fault detector 4 or PV system starts up into an arc, then there is no opportunity to establish an initial no-arc "baseline". Since the arc 30 must still be detected, the third example DC AFD algorithm 94 compares the converted value of the analog signal 45 of the output 26 to a suitable predetermined value.

If the example DC power circuit 6 powers an inverter (not shown), then the noise produced by switching of the inverter does not substantially increase the value of the analog signal 45 of the output 26 of the integrator or minimum detector circuit 22. Otherwise, if the arc 30 is a continuous arc, then this causes the analog signal 45 of the output 26 of the integrator or minimum detector circuit 22 to substantially increase.

EXAMPLE 5

Figure 4:
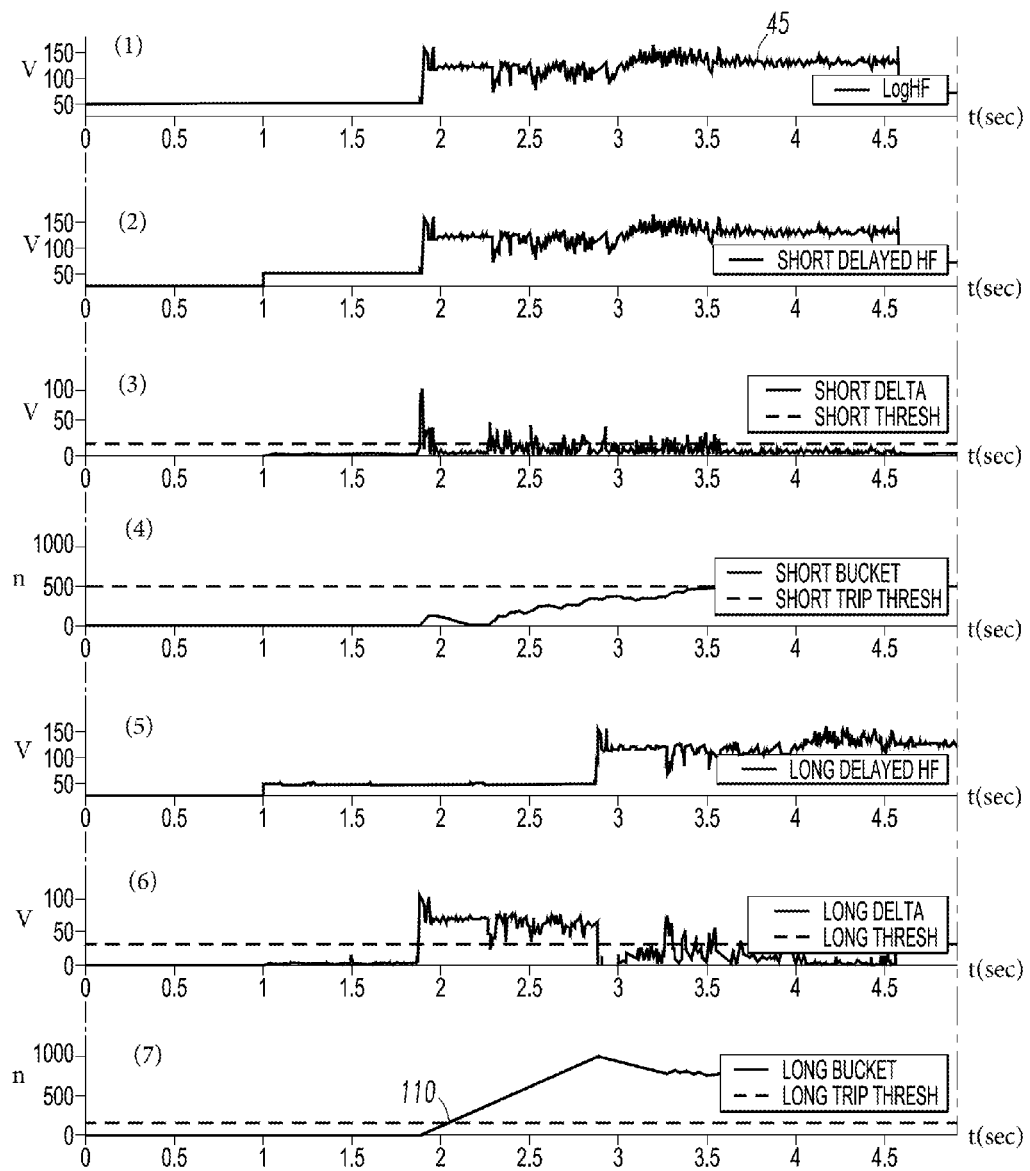
FIGS. 4 and 5 are plots of analog and digital variables employed by the routine of FIGS. 3B1-3B2 in response to a first type of direct current (DC) arc.
Figure 5:
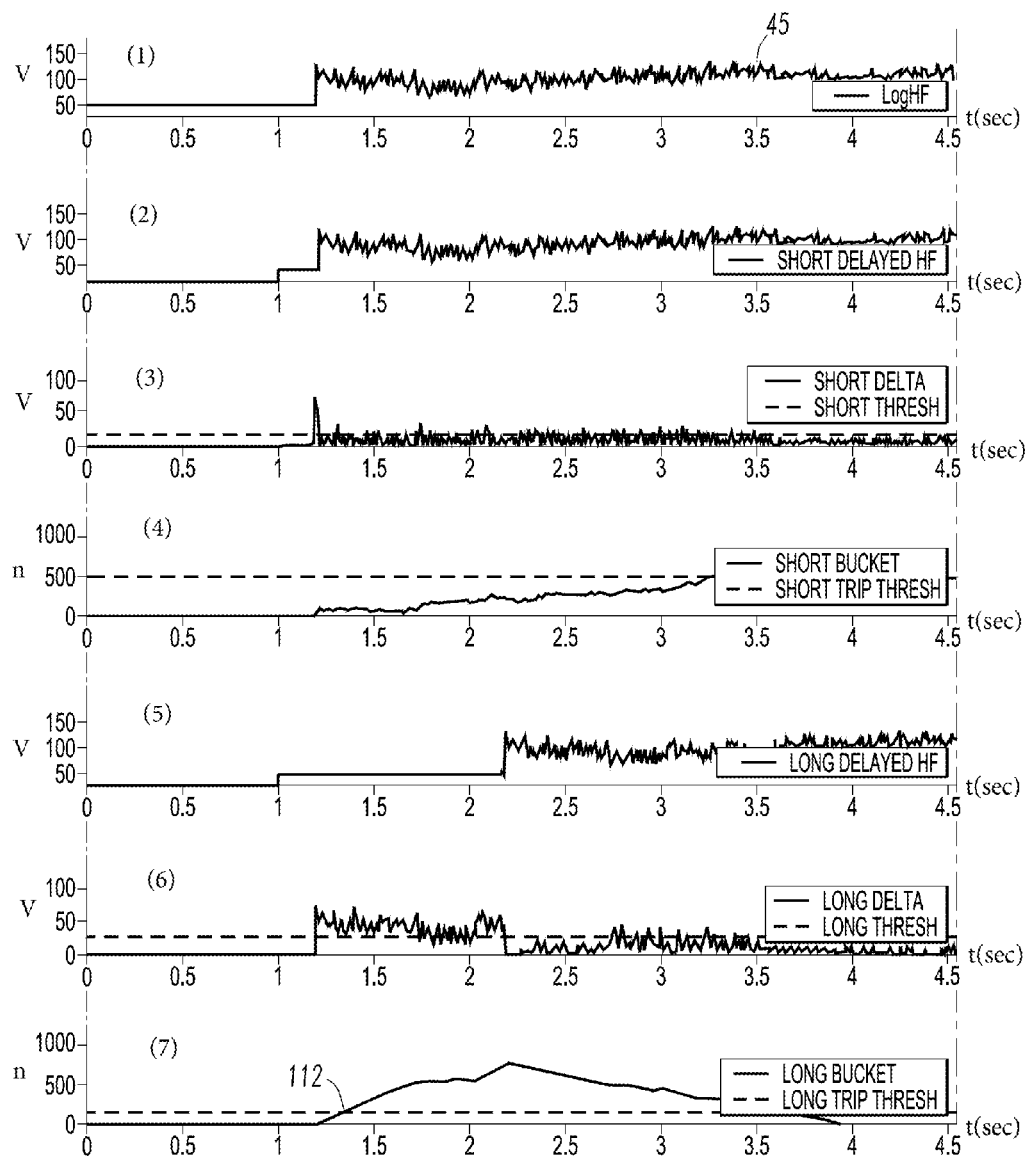

FIGS. 4 and 5 are plots of analog and digital variables employed by the microcomputer 28 of FIG. 1 in response to a first type ("step change") of DC arc. In the examples of FIGS. 4 and 5, the first type arc fault leads to a trip by the second long delay difference algorithm 82 of FIGS. 3B1-3B2.

The plots of FIGS. 4-7 show: (1) the analog signal 45 (LogHF) of the output 26 of the integrator or minimum detector circuit 22; (2) a short delayed version of the analog signal 45 (Short Delayed HF); (3) a difference (Short Delta) between the analog signal 45 and the short delayed version of the analog signal 45, and a corresponding threshold (Short Thresh); (4) the "Short Bucket" and the corresponding short delay threshold (Short Trip Thresh); (5) a long delayed version of the analog signal 45 (Long Delayed HF); (6) a difference (Long Delta) between the analog signal 45 and the long delayed version of the analog signal 45, and a corresponding threshold (Long Thresh); and (7) the "Long Bucket" and the corresponding long delay threshold (Long Trip Thresh).

In FIG. 4, there is a long delay trip at 110, and in FIG. 5, there is a long delay trip at 112.

EXAMPLE 6

Figure 6:
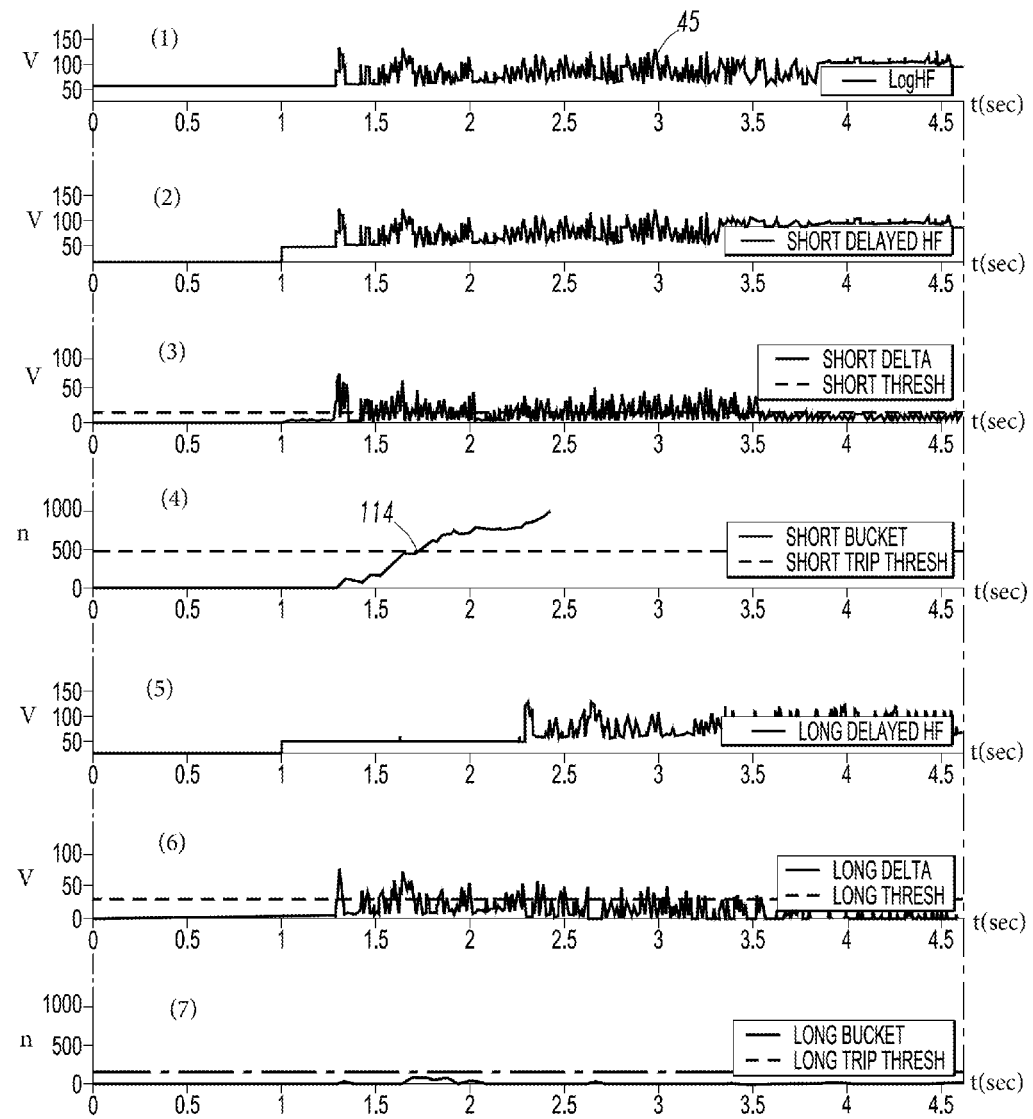
FIGS. 6 and 7 are plots of analog and digital variables employed by the routine of FIGS. 3B1-3B2 in response to a second type of DC arc.
Figure 7:
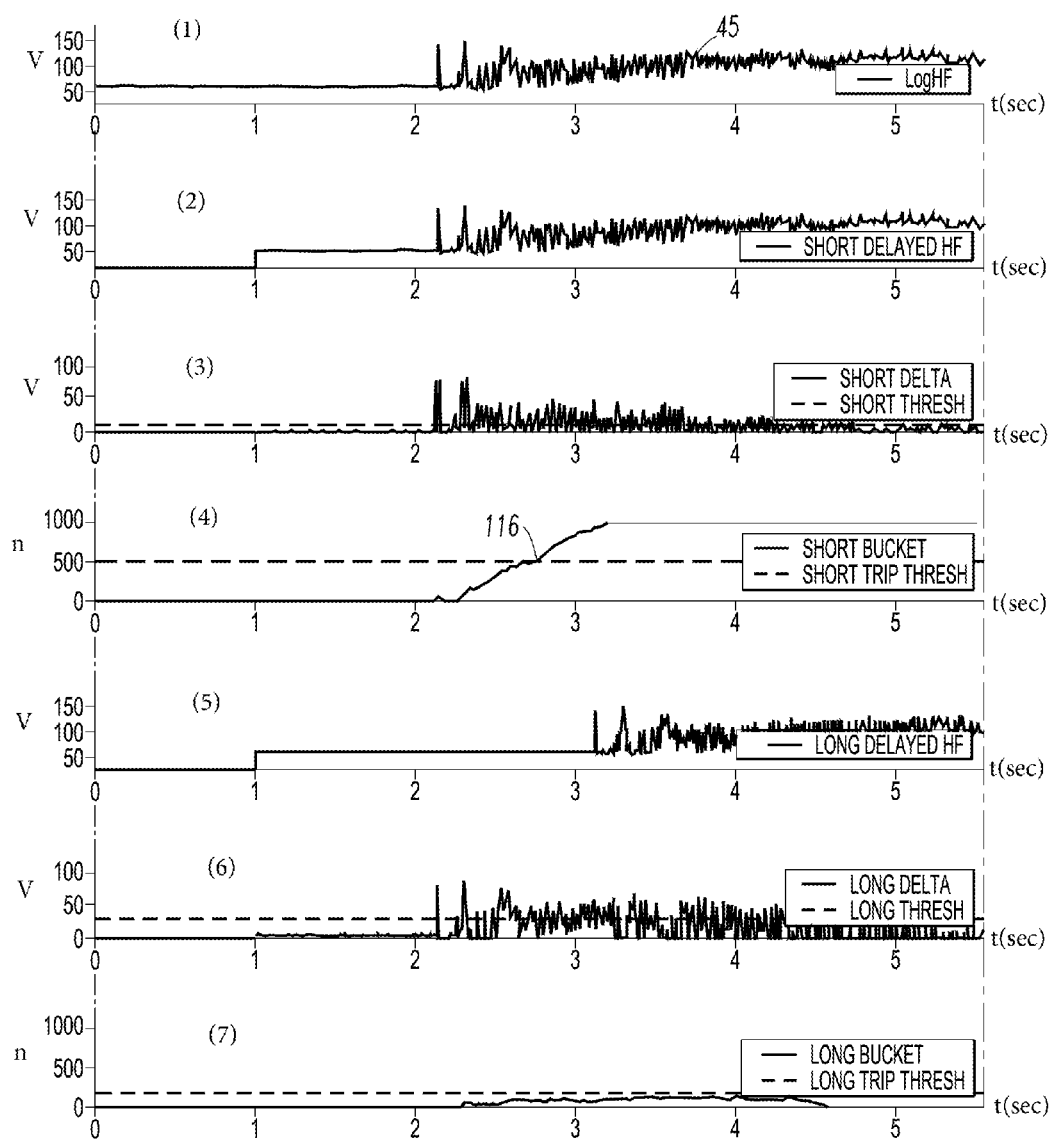

FIGS. 6 and 7 are plots of analog and digital variables employed by the microcomputer 28 of FIG. 1 in response to a second type ("widely fluctuating") of DC arc. In the examples of FIGS. 6 and 7, the second type arc fault leads to a trip by the first short delay difference algorithm 70 of FIG. 3B1.

In FIG. 6, there is a short delay trip at 114, and in FIG. 7, there is a short delay trip at 116.

Although separable contacts 32 are disclosed, suitable solid state separable contacts can be employed. For example, the disclosed arc fault circuit interrupter 2 includes a suitable circuit interrupter mechanism, such as the separable contacts 32 that are opened and closed by the operating mechanism 34, although the disclosed concept is applicable to a wide range of circuit interruption mechanisms (e.g., without limitation, solid state switches like FET or IGBT devices; contactor contacts) and/or solid state based control/protection devices (e.g., without limitation, drives; soft-starters; DC/DC converters) and/or operating mechanisms (e.g., without limitation, electrical, electro-mechanical, or mechanical mechanisms).

As another non-limiting alternative, arc fault current from an array of solar panels, such as a PV array, can be interrupted by shutting down a downstream inverter that connects the PV array to a utility power network.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A direct current arc fault detector for a direct current power circuit having a current flowing therein, said direct current arc fault detector comprising:

a first current sensor structured to sense an alternating current component of the current flowing in said direct current power circuit;

a second current sensor structured to sense a direct current component of the current flowing in said direct current power circuit;

a bandpass filter structured to filter the sensed alternating current component of the current flowing in said direct current power circuit;

a demodulating logarithmic amplifier including an input of the filtered alternating current component of the current flowing in said direct current power circuit, and an output;

an integrator or minimum detector circuit including an input electrically connected to the output of said demodulating logarithmic amplifier, and an output; and a processor structured to repetitively input and then reset the output of said integrator or minimum detector circuit, and:

(a) to increment a first arc fault accumulator when the sensed direct current component of the current flowing in said direct current power circuit is greater than a first predetermined value and a present value of the output of said integrator or minimum detector circuit is different from a previous value of the output of said integrator or minimum detector circuit by more than a second predetermined value with a first predetermined time being between the present value of the output of said integrator or minimum detector circuit and the previous value of the output of said integrator or minimum detector circuit, or otherwise to decrement the first arc fault accumulator, and to determine an arc in said direct current power circuit when the first arc fault accumulator is greater than a third predetermined value; and (b) to increment a second arc fault accumulator when the sensed direct current component of the current flowing in said direct current power circuit is greater than the first predetermined value and the present value of the output of said integrator or minimum detector circuit is greater than another previous value of the output of said integrator or minimum detector circuit by more than a fourth predetermined value with a second predetermined time, which is longer than the first predetermined time, being between the present value of the output of said integrator or minimum detector circuit and said another previous value of the output of said integrator or minimum detector circuit, or otherwise to decrement the second arc fault accumulator, and to determine the arc in said direct current power circuit when the second arc fault accumulator is greater than a fifth predetermined value.

2. The direct current arc fault detector of claim 1 wherein said first current sensor is a current transformer.

3. The direct current arc fault detector of claim 1 wherein said second current sensor is a Hall effect sensor.

4. The direct current arc fault detector of claim 1 wherein said bandpass filter has a center frequency and a pass band.

5. The direct current arc fault detector of claim 1 wherein the first predetermined value is 2 amperes.

6. The direct current arc fault detector of claim 1 wherein the first predetermined time is 20 milliseconds.

7. The direct current arc fault detector of claim 1 wherein the second predetermined time is 1 second.

8. The direct current arc fault detector of claim 1 wherein said incrementing the first arc fault accumulator corresponds to the filtered alternating current component of the current flowing in said direct current power circuit having a fluctuation during said arc.

9. The direct current arc fault detector of claim 1 wherein said incrementing the second arc fault accumulator corresponds to the filtered alternating current component of the current flowing in said direct current power circuit having a step change during said arc.

10. The direct current arc fault detector of claim 1 wherein the processor is further structured:

(c) to increment a third arc fault accumulator when the sensed direct current component of the current flowing in said direct current power circuit is greater than the first predetermined value and the present value of the output of said integrator or minimum detector circuit is greater than a sixth predetermined value, or otherwise to decrement the third arc fault accumulator, and to determine the arc in said direct current power circuit when the third arc fault accumulator is greater than a seventh predetermined value.

11. The direct current arc fault detector of claim 1 wherein said direct current power circuit powers an inverter; and wherein noise produced by switching of said inverter does not substantially increase a voltage of the output of said integrator or minimum detector circuit.

12. The direct current arc fault detector of claim 1 wherein said arc being a continuous arc causes a voltage of the output of said integrator or minimum detector circuit to increase.

13. The direct current arc fault detector of claim 1 wherein said second current sensor is a resistor electrically connected in series with a photovoltaic array in said direct current power circuit.

14. A direct current arc fault circuit interrupter for a direct current power circuit having a current flowing therein, said direct current arc fault circuit interrupter comprising:

separable contacts electrically connectable in series with said direct current power circuit;

an operating mechanism structured to open and close said separable contacts;

a first current sensor structured to sense an alternating current component of the current flowing in said direct current power circuit;

a second current sensor structured to sense a direct current component of the current flowing in said direct current power circuit;

a bandpass filter structured to filter the sensed alternating current component of the current flowing in said direct current power circuit;

a demodulating logarithmic amplifier including an input of the filtered alternating current component of the current flowing in said direct current power circuit, and an output;

an integrator or minimum detector circuit including an input electrically connected to the output of said demodulating logarithmic amplifier, and an output; and a processor structured to repetitively input and then reset the output of said integrator or minimum detector circuit, and:

(a) to increment a first arc fault accumulator when the sensed direct current component of the current flowing in said direct current power circuit is greater than a first predetermined value and a present value of the output of said integrator or minimum detector circuit is different from a previous value of the output of said integrator or minimum detector circuit by more than a second predetermined value with a first predetermined time being between the present value of the output of said integrator or minimum detector circuit and the previous value of the output of said integrator or minimum detector circuit, or otherwise to decrement the first arc fault accumulator, and to determine an arc in said direct current power circuit when the first arc fault accumulator is greater than a third predetermined value; and (b) to increment a second arc fault accumulator when the sensed direct current component of the current flowing in said direct current power circuit is greater than the first predetermined value and the present value of the output of said integrator or minimum detector circuit is greater than another previous value of the output of said integrator or minimum detector circuit by more than a fourth predetermined value with a second predetermined time, which is longer than the first predetermined time, being between the present value of the output of said integrator or minimum detector circuit and said another previous value of the output of said integrator or minimum detector circuit, or otherwise to decrement the second arc fault accumulator, and to determine the arc in said direct current power circuit when the second arc fault accumulator is greater than a fifth predetermined value, and wherein the processor is structured to output a signal to cause said operating mechanism to trip open said separable contacts in response to determining the arc fault in said direct current power circuit.

15. The direct current arc fault circuit interrupter of claim 14 wherein said processor is further structured to detect and interrupt said arc within 800 milliseconds.

16. A method of detecting an arc in a direct current power circuit having a current flowing therein, said method comprising:

sensing an alternating current component of the current flowing in said direct current power circuit;

sensing a direct current component of the current flowing in said direct current power circuit;

bandpass filtering the sensed alternating current component of the current flowing in said direct current power circuit;

providing a value proportional to a logarithm of an envelope of the bandpass filtered alternating current component of the current flowing in said direct current power circuit;

integrating said value to provide an integrated value; and repetitively inputting and then resetting the integrated value;

performing an arc determination function including:

(a) incrementing a first arc fault accumulator when the sensed direct current component of the current flowing in said direct current power circuit is greater than a first predetermined value and a present value of the output of said integrator or minimum detector circuit is different from a previous value of the output of said integrator or minimum detector circuit by more than a second predetermined value with a first predetermined time being between the present value of the output of said integrator or minimum detector circuit and the previous value of the output of said integrator or minimum detector circuit, or otherwise decrementing the first arc fault accumulator, and determining the arc in said direct current power circuit when the first arc fault accumulator is greater than a third predetermined value; and (b) incrementing a second arc fault accumulator when the sensed direct current component of the current flowing in said direct current power circuit is greater than the first predetermined value and the present value of the output of said integrator or minimum detector circuit is greater than another previous value of the output of said integrator or minimum detector circuit by more than a fourth predetermined value with a second predetermined time, which is longer than the first predetermined time, being between the present value of the output of said integrator or minimum detector circuit and said another previous value of the output of said integrator or minimum detector circuit, or otherwise decrementing the second arc fault accumulator, and determining the arc in said direct current power circuit when the second arc fault accumulator is greater than a fifth predetermined value.

* * * * *